United States Patent [19]
Ohira

[11] Patent Number: 6,118,347
[45] Date of Patent: Sep. 12, 2000

[54] VOLTAGE CONTROLLED OSCILLATOR MOUNTING ASSEMBLY

[75] Inventor: Kazuhide Ohira, Kanagawa, Japan

[73] Assignee: Mitsumi Electric Co., Ltd., Tokyo, Japan

[21] Appl. No.: 09/237,225

[22] Filed: Jan. 26, 1999

[30] Foreign Application Priority Data

Jan. 30, 1998 [JP] Japan .................................. 10-033847

[51] Int. Cl.[7] ................................ H05K 5/00; H05K 7/02
[52] U.S. Cl. .............................. 331/68; 331/67; 361/752; 361/800; 361/801; 361/818; 174/35 R; 174/52.1
[58] Field of Search .................................. 331/68, 67, 62; 361/800, 810, 816, 818, 752, 801; 174/35 R, 52.1

[56] References Cited

U.S. PATENT DOCUMENTS 5,153,379  10/1992  Guzuk et al. .
5,650,755   7/1997  Avanic et al. ............................ 331/67

*Primary Examiner*—Arnold Kinkead
*Attorney, Agent, or Firm*—McGuire, Woods, LLP

[57] ABSTRACT

An electronic apparatus is comprised of a main board 1 having a main-circuit mounting region 6 and an oscillating-circuit mounting region 2; a shielding case 5 for covering the oscillating-circuit mounting region by being attached to the main board; a sub-board 10 on which circuit components 3 and 4 constituting an oscillating circuit portion 11 are mounted and which is supported at a position spaced part from the main board inside the shielding case; and a connector 12 for electrically connecting the sub-board and the main board.

10 Claims, 3 Drawing Sheets

VOLTAGE CONTROLLED OSCILLATOR MOUNTING ASSEMBLY

BACKGROUND OF THE INVENTION

RELATED ART

The present invention relates to an electric apparatus incorporating an oscillating circuit portion, and more particularly to an electronic apparatus in which the mounting structure of an oscillating circuit portion is improved to ensure that an oscillating function does not become unstable due to vibration and impact from the outside.

An electronic apparatus for communication such as a specific small power apparatus incorporates an oscillating circuit for generating a high-frequency signal necessary for transmission and reception. In a case where a PLL synthesizer type is adopted as the oscillating circuit of this type, its component elements are a voltage-controlled oscillator (VCO) and a phase-locked loop (PLL). As it has become possible to realize the VCO and the PLL in the form of one-chip ICs, respectively, by the use of the semiconductor integration technology in recent years, as shown in an assembly perspective view of FIG. 4, the oscillating circuit can be arranged by a simple structure in which a VCO circuit 3 and a PLL circuit (IC) 4 are mounted in an oscillating-circuit mounting region 2 on a main board 1, and its surface is covered with a shielding case 5. The main board 1 is a printed circuit board, and a main-circuit mounting region 6 for mounting other main circuit components is generally set on its surface so as to be larger than the oscillating-circuit mounting region 2.

In the mounting structure shown in FIG. 4, since the VCO circuit 3 and the PLL circuit 4 of the oscillating circuit portion are directly mounted on the main board 1, when an external force such as vibration and impact from the outside is applied to the main board 1, the external force is directly transmitted to the VCO circuit 3 and the PLL circuit 4, and can disadvantageously affect their electric characteristics.

SUMMARY OF THE INVENTION

To overcome the above-described problem, the present invention has its object to provide an electronic apparatus which adopts a mounting structure in which the vibration and impact from the outside are made difficult to be transmitted to the oscillating circuit portion, thereby stabilizing the oscillating operation.

The above object of the present invention can be attained by an electronic apparatus comprising: a main board having a main-circuit mounting region and an oscillating-circuit mounting region; a shielding case for covering the oscillating-circuit mounting region by being attached to the main board; a sub-board on which circuit components constituting an oscillating circuit portion are mounted and which is supported at a position spaced part from the main board inside the shielding case; and a connector for electrically connecting the sub-board and the main board.

In accordance with an embodiment of the present invention, the oscillating circuit portion is of a PLL synthesizer type using a VCO and a PLL. In addition, the shielding case is formed by drawing. The other objects, forms, and advantages of the present invention will become apparent from the embodiments of the present invention which will be described below.

DETAILED DESCRIPTION OF THE PREFERRED EMBODIMENTS

Figure 1:
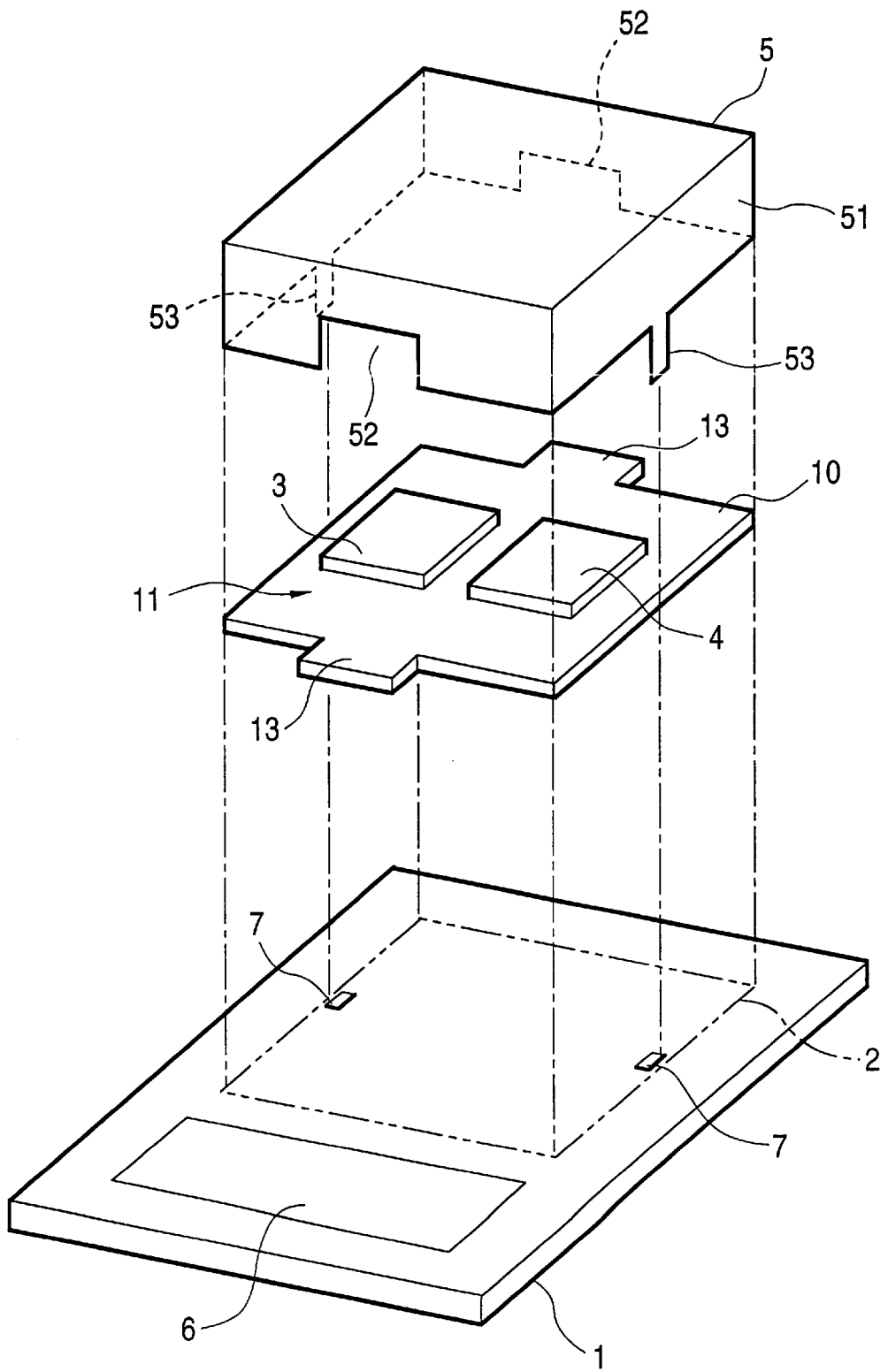
FIG. 1 is an assembly perspective view illustrating an embodiment of an electronic apparatus of the present invention.
Figure 2:
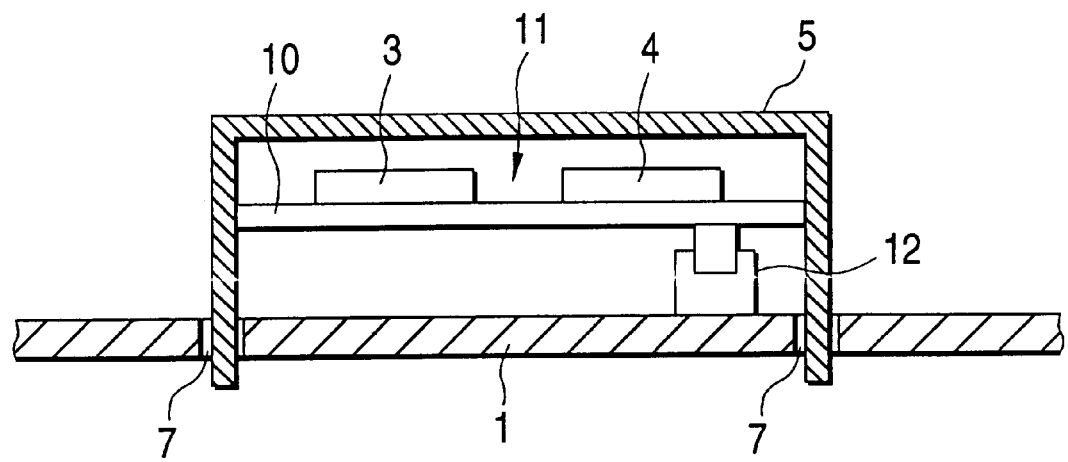
FIG. 2 is a cross-sectional view of an assembled state of the electronic apparatus shown in FIG. 1.

Referring to the embodiments shown in the drawings, a detailed description will be given hereafter of the present invention. FIGS. 1 and 2 are an assembly perspective view and a cross-sectional view illustrating an embodiment of the present invention. In the drawings, reference numeral 1 denotes a main board having a main-circuit mounting region 6 and an oscillating-circuit mounting region 2; 5, a shielding case for covering the oscillating-circuit mounting region 2 by being attached to the main board 1; 10, a sub-board on which circuit components 3 and 4 constituting an oscillating circuit portion 11 are mounted and which is supported at a position spaced apart from the main board 1 inside the shielding case 5; and 12, a connector for electrically connecting the sub-board 10 and the main board 1.

The shielding case 5 is formed in the shape of a box with its bottom open by using an electrically conductive metal plate. A pair of rectangular cutout portions 52 are respectively formed in a pair of opposing side walls of four side walls 51 of the case 5, and a pair of leg portions 53 projecting downward are formed at lower ends of the other pair of opposing side walls.

The sub-board 10 is a special purpose printed circuit board which constitutes a part of the oscillating circuit portion 11, and its area is set to a size allowing the sub-board 10 to be accommodated in the shielding case 5. A pair of projecting portions 13 corresponding to the cutout portions 52 of the shielding case 5 are formed integrally on this sub-board 10 in such a manner as to project from a pair of its opposing end portions. As the projecting portions 13 are fitted in the cutout portions 52, the sub-board 10 is supported at a position spaced part (lifted up) from the main board 1 inside the shielding case 5.

As described above, the main circuit board 1 has the main-circuit mounting region 6 and the oscillating-circuit mounting region 2, and a pair of soldering through holes 7, into which the leg portions 53 of the shielding case 5 are inserted, are formed in end portions of the latter oscillating-circuit mounting region 2. The leg portions 53 are inserted in these through holes 7, and are soldered at the rear surface of the board 1. Signal lines and power supply lines of the main board 1 and the sub-board 10 are electrically connected by the PC—PC connectors 12 which are respectively mounted separately on the main board 1 and the sub-board 10.

As is apparent from the cross-sectional view in FIG. 2, in the mounting structure of the present invention, since all of the VCO circuit 3 and the PLL circuit 4 which constitute the oscillating circuit portion 11 are mounted on the sub-board 10, and the sub-board 10 is supported in such a manner as to be lifted up at a position spaced apart from the main board 1, even if vibration and impact are applied to the main board 1 from the outside, the force is not directly transmitted to the oscillating circuit portion 11. Accordingly, it is possible to prevent the deterioration of the characteristics of the oscillating circuit portion 11 by the external force. The surrounding portions of the oscillating circuit portion 11 are electromagnetically shielded in the same way as in the conventional manner.

Figure 3:
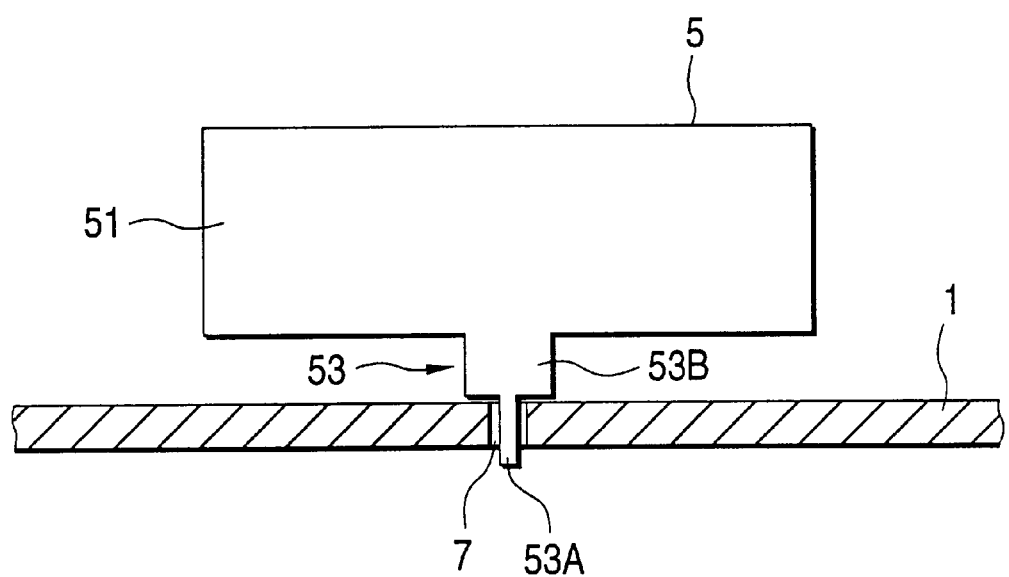
FIG. 3 is a partly sectional side elevational view illustrating another embodiment of the present invention.
Figure 4:
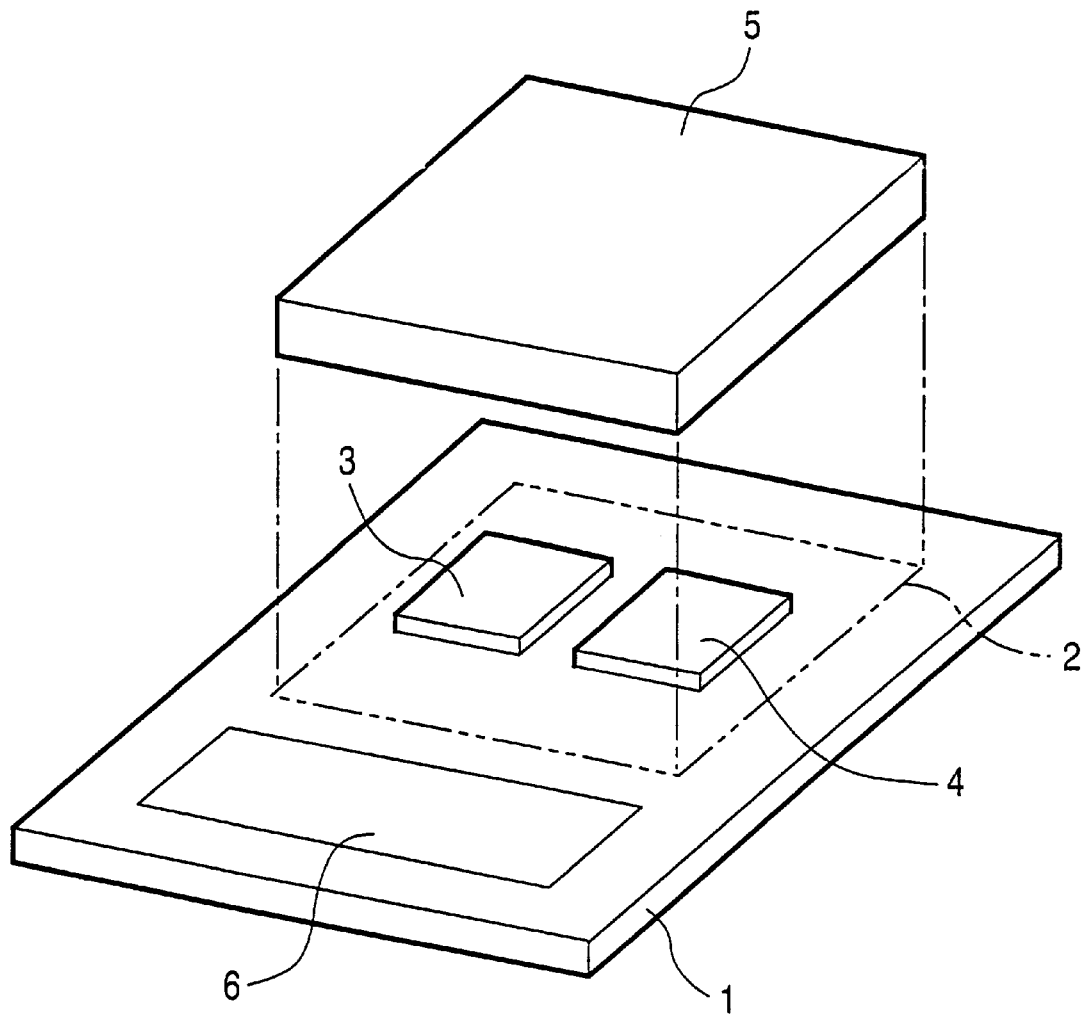
FIG. 4 is an assembly perspective view illustrating a component-mounting structure of a conventional electronic apparatus.

FIG. 3 is a partly sectional side elevational view illustrating another embodiment of the present invention. In this embodiment, in addition to the configuration shown in FIGS. 1 and 2, each leg portion 53 of the shielding case 5 is formed in a two-step configuration. That is, the leg portion 53 is provided with a narrow portion 53A which is inserted in the through hole 7 of the main board 1 as well as a wide portion 53B which is interposed between the narrow portion 53A and the side wall 51 of the case 5, such that the side wall 51 of the case 5 is spaced apart from the surface of the main board 1. By adopting such a configuration, the external force from the main board 1 becomes more difficult to be transmitted to the sub-board 10. It should be noted that, in either case, if the shielding case 5 is formed from a metal plate by drawing, the shielding effect becomes high, so that the electronic apparatus can be made stable as a PLL module.

As described above, in accordance with the present invention, since the mounting structure provided is such that a sub-board exclusively used for an oscillating circuit is provided in addition to the main board, and this sub-board is supported in a state of being lifted up inside the shielding case, it is possible to provide an electronic apparatus which is highly resistant against vibration and impact from the outside and capable of performing stable oscillating operation.

What is claimed is:

1. An electronic apparatus comprising:
    a main board having a main-circuit mounting region and an oscillating-circuit mounting region;
    a shielding case for covering said oscillating-circuit mounting region by being attached to said main board, said shielding case having a pair of cutout portions formed in opposing sidewalls thereof;
    a sub-board on which circuit components including an oscillating circuit portion are mounted, said sub-board having a pair of projecting portions corresponding to the cutout portions, whereby said sub-board is supported at a position spaced apart from said main board inside said shielding case by fitting the projecting portions into the cutout portions; and
    a connector for electrically connecting said sub-board and said main board.

2. The electronic apparatus according to claim 1, wherein the oscillating circuit portion is of a phased-locked loop (PLL) synthesizer type using a voltage-controlled oscillator (VCO) and a PLL.

3. The electronic apparatus according to claim 1, wherein said shielding case is formed by drawing.

4. The electronic apparatus as recited in claim 1, wherein the cutout portions and the projecting portions are rectangular.

5. The electronic apparatus as recited in claim 1, wherein said shielding case further comprises a downwardly projecting pair of legs formed on opposing sidewalls thereof, the legs being inserted into respective through holes of said main board so that a space exists between the sidewalls and said main board.

6. The electronic apparatus according to claim 5, wherein the oscillating circuit portion is of a phase-locked loop (PLL) synthesizer type using a voltage-controlled oscillator (VCO) and a PLL.

7. The electronic apparatus as recited in claim 6, wherein the cutout portions and the projecting portions are rectangular.

8. The electronic apparatus as recited in claim 5, wherein the projecting legs are formed on a first pair of opposing sidewalls, and the cutout portions are formed on a second pair of opposing sidewalls.

9. The electronic apparatus according to claim 8, wherein the oscillating circuit portion is of a PLL synthesizer type using a VCO and a PLL.

10. The electronic apparatus as recited in claim 8, wherein the cutout portions and the projecting portions are rectangular.

* * * * *